(12) United States Patent
Ashjaee et al.

(10) Patent No.: US 6,855,037 B2
(45) Date of Patent: Feb. 15, 2005

(54) METHOD OF SEALING WAFER BACKSIDE FOR FULL-FACE ELECTROCHEMICAL PLATING

(75) Inventors: Jalal Ashjaee, Cupertino, CA (US); Homayoun Talieh, San Jose, CA (US); Bulent Basol, Manhatten Beach, CA (US); Konstantin Volodarsky, San Francisco, CA (US)

(73) Assignee: ASM-Nutool, Inc., Milpitas, CA (US)

( * ) Notice: Subject to any disclaimer, the term of this patent is extended or adjusted under 35 U.S.C. 154(b) by 0 days.

(21) Appl. No.: 09/910,686

(22) Filed: Jul. 20, 2001

(65) Prior Publication Data

US 2002/0127956 A1 Sep. 12, 2002

Related U.S. Application Data

(60) Provisional application No. 60/275,406, filed on Mar. 12, 2001.

(51) Int. Cl.[7] ................................................ B24B 1/00
(52) U.S. Cl. .............................. 451/57; 451/67; 451/41; 451/288; 451/388; 451/398
(58) Field of Search ................................ 451/287–289, 451/388, 398, 41, 57, 67

(56) References Cited

U.S. PATENT DOCUMENTS

| | | | |
|---|---|---|---|
| 4,043,894 A | | 8/1977 | Gibbs |
| 5,096,536 A | | 3/1992 | Cathey, Jr. |
| 5,374,594 A | | 12/1994 | van de Ven et al. |
| 5,635,083 A | * | 6/1997 | Breivogel et al. ............ 216/88 |
| 5,773,953 A | | 6/1998 | Ukaji et al. |
| 5,795,215 A | * | 8/1998 | Guthrie et al. ............... 451/286 |
| 5,797,789 A | | 8/1998 | Tanaka et al. ............... 451/289 |
| 5,804,507 A | | 9/1998 | Perlov et al. |
| 5,925,411 A | | 7/1999 | van de Ven et al. |
| 6,024,630 A | * | 2/2000 | Shendon et al. ............... 451/41 |
| 6,149,727 A | | 11/2000 | Yoshioka et al. |
| 6,228,233 B1 | | 5/2001 | Lakshmikanthan et al. |
| 6,290,577 B1 | | 9/2001 | Shendon et al. ............... 451/41 |
| 6,390,905 B1 | * | 5/2002 | Korovin et al. .............. 415/286 |
| 2002/0061716 A1 | | 5/2002 | Korovin et al. |

FOREIGN PATENT DOCUMENTS

| | | |
|---|---|---|
| EP | 1 067 590 | 1/2001 |
| EP | 1197292 A2 | 4/2002 |

OTHER PUBLICATIONS

International Search Report mailed Mar. 16, 2004, PCT/US03/17228.

* cited by examiner

Primary Examiner—George Nguyen
(74) Attorney, Agent, or Firm—Pillsbury Winthrop LLP

(57) ABSTRACT

The present invention provides a wafer carrier that includes an opening, which in one embodiment is a plurality of holes, disposed along the periphery of the wafer carrier. A gas emitted through the holes onto a peripheral back edge of the wafer assists in preventing the processing liquids and contaminants resulting therefrom from reaching the inner region of the base and the backside inner region of the wafer. In another embodiment, a plurality of concentric sealing members are used to prove a better seal, and the outer seal is preferably independently movable to allow cleaning of a peripheral backside of the wafer to occur while the wafer is still attached to the wafer carrier.

38 Claims, 15 Drawing Sheets

METHOD OF SEALING WAFER BACKSIDE FOR FULL-FACE ELECTROCHEMICAL PLATING

This application is related to and claims priority from U.S. Provisional Application No. 60/275,406 filed on Mar. 12, 2001 and entitled Wafer Carrier For Wet Processes.

BACKGROUND OF THE INVENTION

1. Field of the Invention

The present invention generally relates to semiconductor processing technologies and, more particularly, to a versatile wafer carrier.

2. Description of the Related Art

Conventional semiconductor devices generally include a semiconductor substrate, usually a silicon substrate, and a plurality of sequentially formed dielectric interlayers such as silicon dioxide and conductive paths or interconnects made of conductive materials. The interconnects are usually formed by filling a conductive material in trenches etched into the dielectric interlayers. In an integrated circuit, multiple levels of interconnect networks laterally extend with respect to the substrate surface. The interconnects formed in different layers can be electrically connected using vias or contacts. A conductive material filling process of such features, i.e., via openings, trenches, pads or contacts can be carried out by depositing a conductive material over the substrate including such features.

Copper and copper alloys have recently received considerable attention as interconnect materials because of their superior electromigration and low resistivity characteristics. The preferred method of copper deposition is electrodeposition. During fabrication, copper or another conductive material is deposited on a substrate that has been previously coated with a conductor, typically a barrier layer and then a seed layer. Typical seed layers are made of copper and its alloys. Typical barrier materials generally include tungsten, tantalum, titanium, their alloys, and their nitrides. The deposition process can be carried out using a variety of processes.

After depositing copper into the features on the semiconductor wafer surface, a removal process, such as an etching, an electro polishing or a chemical mechanical polishing (CMP) step, may be employed. Such removal processes remove the conductive materials off the surface of the wafer, particularly the field regions, thereby leaving the conductive materials primarily disposed within the features, such as vias, trenches and the like.

During the deposition process or the removal process the wafer is generally held by a carrier head. As shown in FIG. 1A, a conventional carrier head 10 having a rotatable shaft 12 holds a wafer 14 during the electrodeposition process. The wafer 14 is placed on a surface 16 of a carrier base 18 (chuck) of the carrier head 10. During the deposition and/or material removal step, the carrier head 10 secures the wafer 14 to the surface 16 of the base 18 of the carrier head 10 by applying vacuum to the back of the wafer and using clamps 20. The vacuum is applied using vacuum lines 22 extending through the carrier base 18 and the body of the carrier head 10. Clamps 20 may also seal electrical contacts 24 to the wafer 14. In such a conventional carrier head, because of the clamp around the periphery of the wafer, no deposition or material removal occurs at the edge of the wafer.

In use, the carrier head is immersed into a solution, typically an electrolyte in a deposition and certain material removal processes, or a slurry in a CMP material removal process, for example. In processes where moveable contact with a pad is desired, such as for polishing, such a pad will be included. During any such process, it is important to prevent leakage of the solution to the backside of the wafer. Such leakages to the backside of the wafer contaminate the wafer backside and the electrical contacts. Removal of contaminants from the wafer backside requires an extra process step that is time consuming and increases manufacturing costs.

Another conventional wafer carrier design does not use vacuum suction on the back of the wafer to retain the wafer on the carrier and attempts to reduce contamination of the wafer backside and wafer edge during processing. Referring to FIG. 1B, with such a wafer carrier 28, the back surface 30 of the wafer 32 is pressed against an o-ring 34 to form a seal between the back surface 30 of the wafer and the o-ring 34. Also, a clamp 36 including a seal 38 seals a perimeter of the front surface 40 of the wafer 32 while housing the plurality of contacts 42 to the front surface 40. In this prior art system, a region 44 behind the seal can be pressurized with gas to further prevent contamination at the wafer backside. In such designs, because of the clamp around the periphery of the wafer, no deposition or material removal occurs at the edge of the wafer.

Yet another conventional CMP head is similar to the head shown in FIG. 1A, but it holds the wafer from the back side by vacuum when positioning the wafer for processing and from the circumference of the wafer by a retaining ring during processing, thereby fully exposing the front surface of the wafer. While the CMP process is done over the front surface of the wafer, the slurry from the CMP process can nevertheless migrate toward the back surface of the wafer.

To this end, there is a need for a wafer carrier design that that may be used throughout either one or more process steps and be able to seal back of the wafer from the process solutions. There is also a need for a wafer carrier design that seals back of the wafer from the process solutions while exposing the entire front surface of the wafer for processing without excluding processing at the edge of the wafer.

SUMMARY OF THE INVENTION

It is an object of the present invention to provide an improved wafer carrier.

It is another object of the present invention to provide a wafer carrier that prevents processing liquids and contaminants resulting therefrom from reaching a backside inner region of the wafer.

It is a further object of the present invention to provide a wafer carrier that prevents processing liquids and contaminants resulting therefrom from reaching an inner region of the base and a backside inner region of the wafer.

The present invention attains the above objects, considered singly or in combination, among others, by providing a wafer carrier that includes an opening, which in one embodiment is a plurality of holes, disposed along the periphery of the wafer carrier. A gas emitted through the holes onto a peripheral back edge of the wafer assists in preventing the processing liquids and contaminants resulting therefrom from reaching the inner region of the base and the backside inner region of the wafer. In another embodiment, a plurality of concentric sealing members are used to prove a better seal, and the outer seal is preferably independently movable to allow cleaning of a peripheral backside of the wafer to occur while the wafer is still attached to the wafer carrier.

Further, a sealing member, which are alternatively an o-ring, gasket, or inflatable member are used in specific embodiments to assist in preventing the processing liquids and contaminants resulting therefrom from reaching the backside inner region of the wafer.

As noted in more detail below, the above-described characteristics of the wafer carrier can be used on different wafer carriers that are used in various processing environments.

BRIEF DESCRIPTION OF THE DRAWINGS

The above and other objectives, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION OF THE PREFERRED EMBODIMENTS OF THE PRESENT INVENTION

Figure 1A:
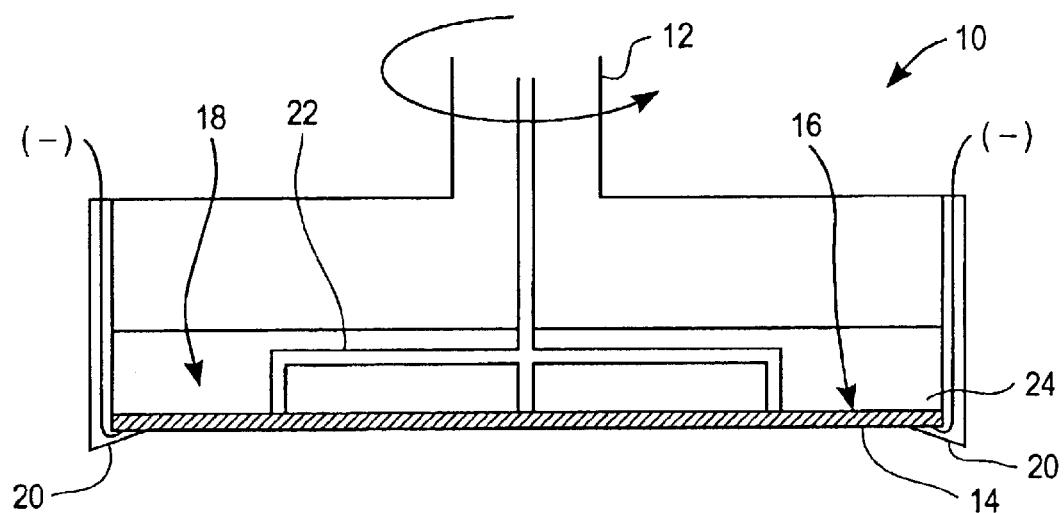
FIGS. 1A and 1B illustrate various conventional carrier heads.
Figure 1B:
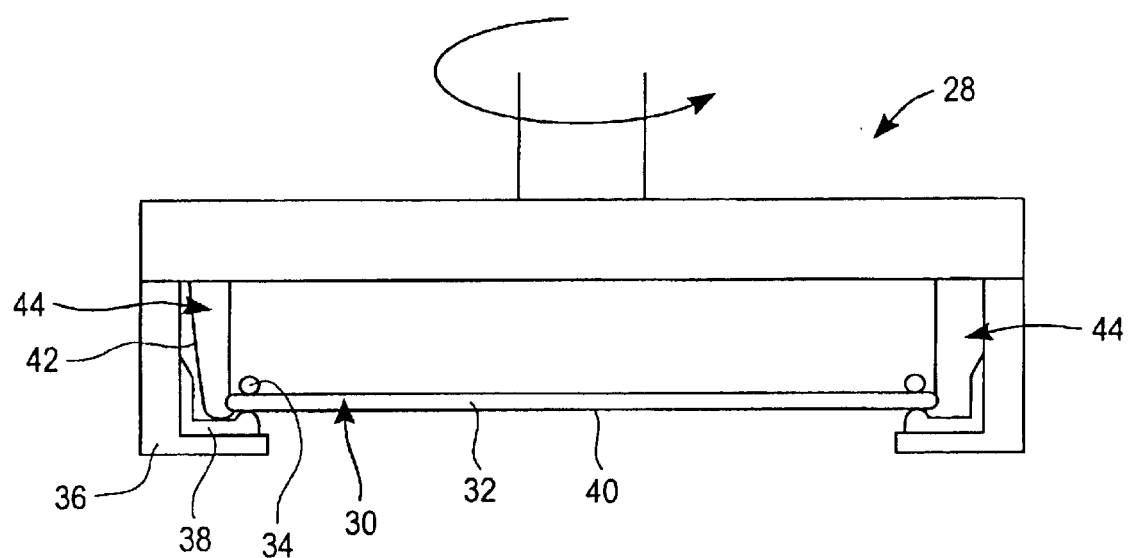
Figure 2:
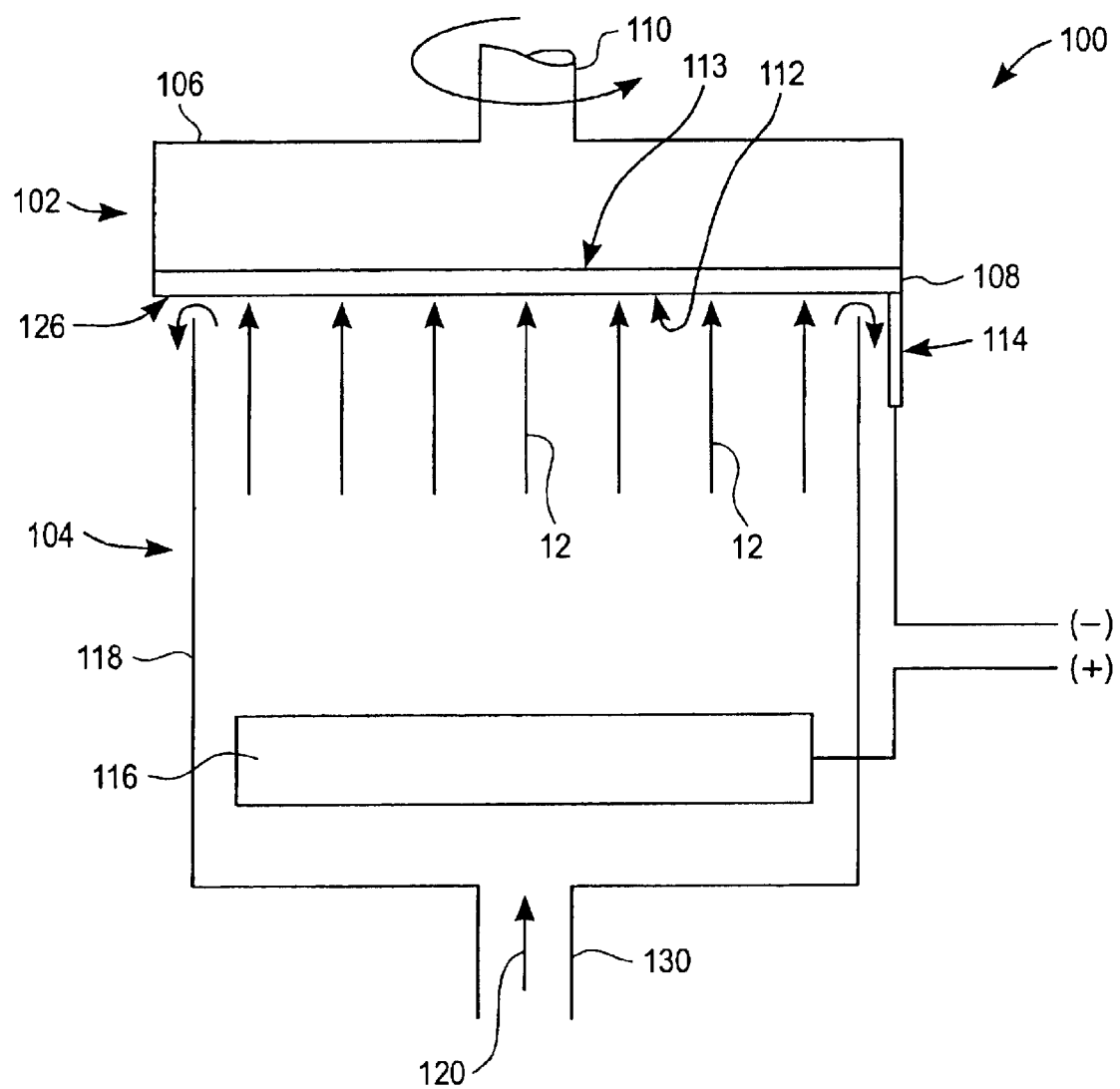
FIG. 2 illustrates an exemplary processing system on which carrier heads according to the present invention may be used.

Reference will now be made to the drawings wherein like numerals refer to like parts throughout. FIG. 2, shows an exemplary processing system 100. When used for electrodeposition, the system 100 may, for example, include a cathode assembly 102 and an anode assembly 104 and can then deposit a conductive material such as copper on a workpiece or substrate, such as semiconductor wafer. When used for material removal, the system 100 may, for example, have the polarity of the anode and cathode reversed, or instead use other processing chemicals, such as a CMP slurry. It should be understood that the particular process in which the present invention is used is not of particular importance. What is significant, as illustrated hereinafter, is prevention of contamination of a processing solution from reaching a backside of a wafer. And in certain embodiments, also allowing for full face processing of the wafer to occur.

It should also be noted that in the description provided below in which copper is used as an example material that is deposited during a deposition process, other conductors can also be deposited during deposition processing, for example Ni, Pd, Pt, Au, Pb, Sn, Ag and their alloys.

The wafer holding assembly 102 of the system 100 includes a wafer carrier 106, shown in FIG. 2 holding an exemplary wafer 108, which can be referred to as the cathode during deposition, the anode during electropolishing, or just the wafer if a process that does not require a current flow/voltage differential to exist. During deposition, for example, a front surface 112 of the wafer 108 is connected to a negative terminal of a power supply (not shown) by electrical contact members 114. During electropolishing, for example, the front surface 112 of the wafer 108 is connected to a positive terminal of a power supply (not shown) by electrical contact members 114.

As will be described more fully below, the wafer carrier 106 holds the wafer 108 from a back surface 113 of the wafer 108 using vacuum suction. In this embodiment, the wafer 108 is held by the wafer carrier 106 so that a front surface 112 of the wafer 108 is fully exposed. During the process, the wafer carrier 106 and hence the wafer 108 are moved by rotating a carrier shaft 110 about a rotation axis 115 or vertical axis and/or by laterally translating the carrier shaft 110.

The electrode assembly 104 of the system 100 will typically have a different type of electrode 116, depending upon whether assembly 104 is being used for deposition or electropolishing. When used for deposition, the electrode 116 is an anode, preferably a consumable copper anode, and when used for electropolishing, the electrode 116 is a cathode, and is preferably not consumable. The electrode 116 may preferably be placed into an enclosure such as an electrode cup 118. The electrode 116 may have holes that allow the electrolyte to flow therethrough (not shown). The electrode cup 118 may have bleeding openings (not shown) to control the amount of the flow of solution, such as electrolyte when used for deposition and certain electropolishing techniques, or slurry if CMP is being used, for example. During processing, the solution 120 is pumped into the electrode cup 118 through a liquid inlet 130 to reach and wet the front surface 112 of the wafer 108. The solution 120 flows in the direction of arrows and wets the front surface 112 of the wafer 108.

During deposition or certain electropolishing processes, typically the solution 120 is an electrolyte that is used to deposit material on the front surface 112 of the wafer 108 under applied appropriate potential or remove material from the front surface 112 of the wafer 108 under applied appropriate potential. During CMP, such potential may or may not be applied. With all processes, however, the wafer front surface 112 is preferably rotated. as is known.

In the system 100, electrical contact members 114 contact wafer 108 on a contact region 126, as shown in FIG. 2. The contact region 126 is a peripheral ring region on the front surface of the wafer that has a portion thereof that is always exposed over the edge of the electrode cup 118 as the wafer is rotated.

Figure 3A:
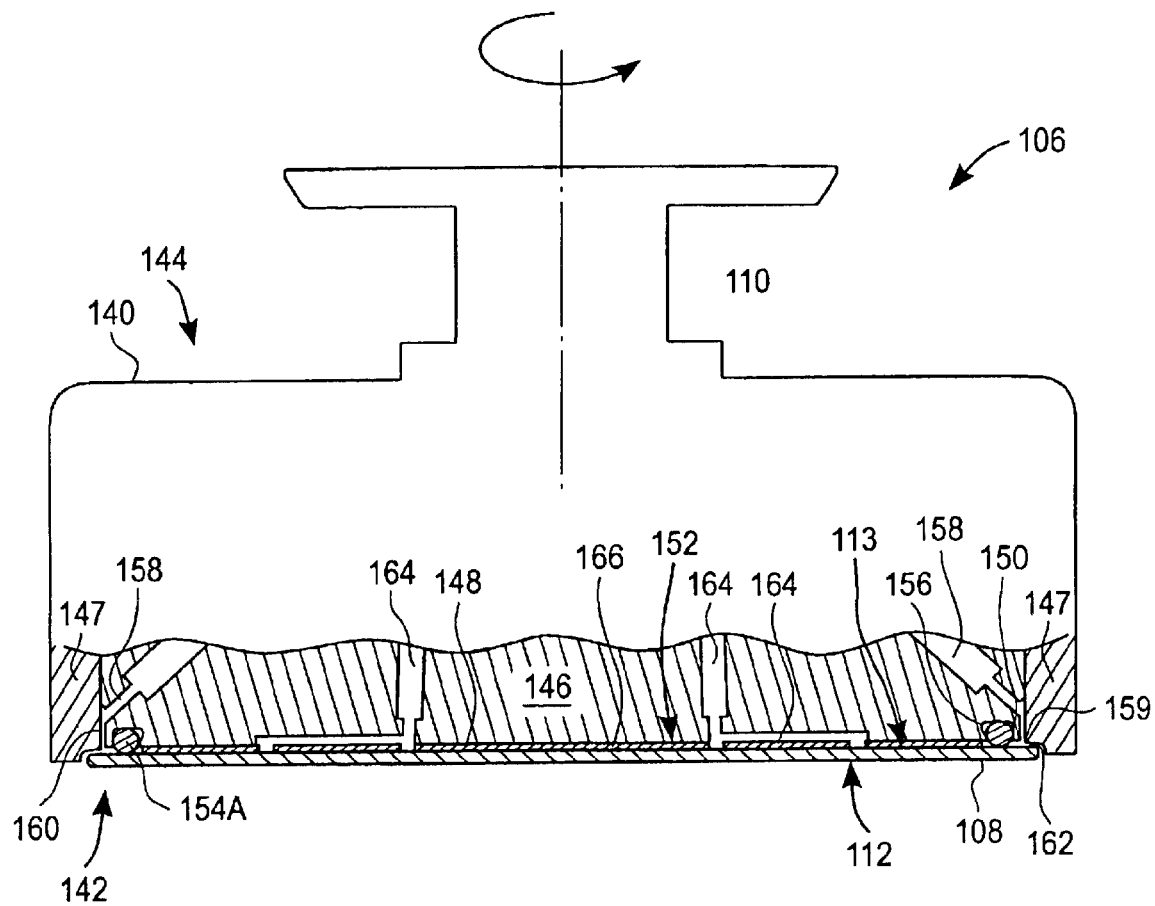
FIGS. 3A and 3B illustrate more detailed views of wafer carriers according to two embodiments of the present invention.
Figure 3B:
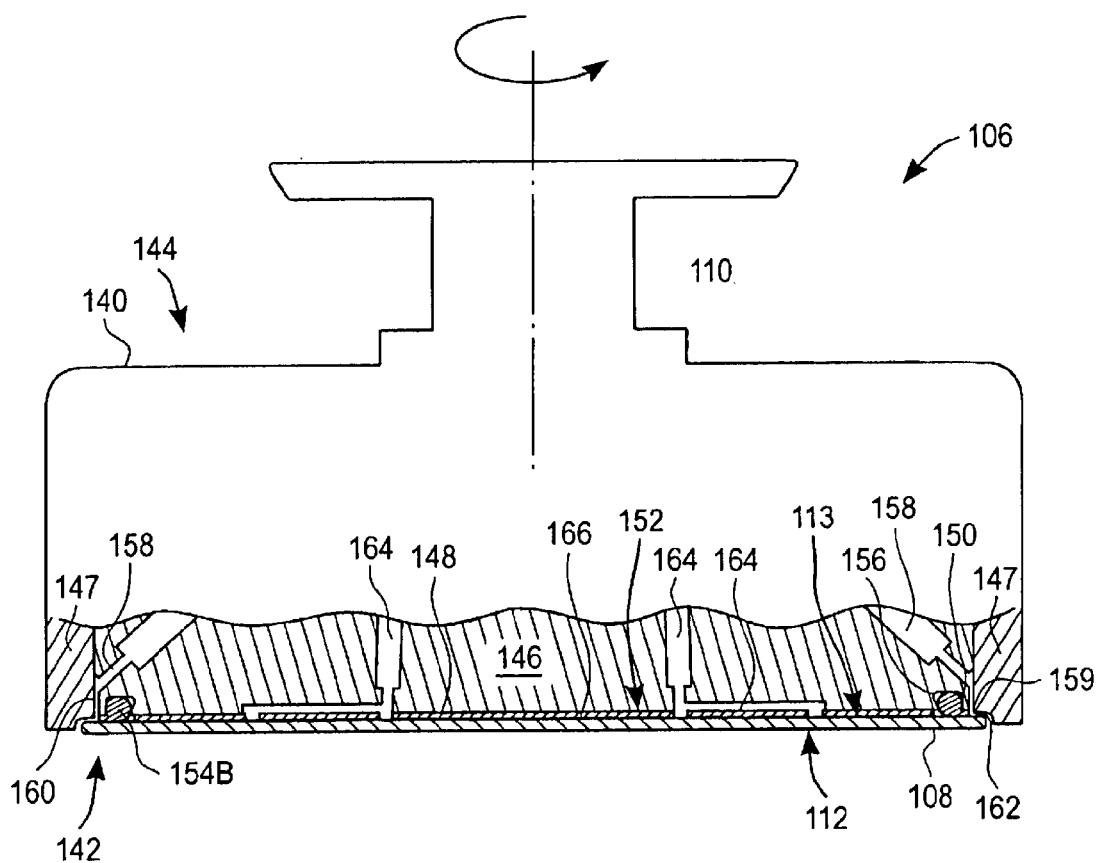

FIGS. 3A and 3B each illustrate a side view with a cut-away of the wafer carrier 106 of embodiments of the present invention in further detail. As will become apparent, the difference between the embodiments illustrated in FIGS. 3A and 3B is the type of sealing member 154 that is used. The wafer carrier 106 comprises a carrier body 140 having a lower and upper end 142 and 144. The lower end 142 of the carrier 106 comprises a carrier base 146, chuck, upon which the wafer 108 is held. The carrier base may be made of variety of materials, such as plastic, steel or titanium. And, as shown the carrier ring 147 can have a surface portion that extends below the surface of the wafer that contacts the support pad 166 described further below to prevent lateral movement of the wafer 108 beyond the surface portion that extends below the backside surface of the wafer 108. The carrier base 146 is preferably surrounded by a carrier ring 147. The carrier ring may be constructed separately or may be an integral part of the carrier base. The carrier ring may be made of plastic or any material that is stable in the process solutions. The wafer carrier 106 is rotated or moved through the shaft 110. In this embodiment, a bottom surface 148 of the carrier base 146, preferably disk shaped, includes a first surface portion 150 and a second surface portion 152. The first surface portion 150 is a peripheral surface surrounding the second surface portion 152 that is an inner region. The first and second surface portions 150, 152 of the bottom surface 148 are established by a sealing member 154 of the present invention, described hereinafter.

The sealing member 154 is placed into a circular groove 156 formed in the bottom surface 148 and between the first and second surfaces 150, 152 defines an inner region of the base 146, and, when the sealing member 154 contacts the back side of the wafer 108, establishes a backside inner region of the wafer 108. Fluid lines 158 connect a fluid supply to a plurality of outlet ports 159 on the first surface portion 150 of the bottom surface 148, as described further hereinafter. The outlet ports 159 are radially distributed around the first surface 150, such that the outlet ports are formed concentrically around the sealing member 154. Although it may be directly connected to the first surface portion 150, a lower end 160 of the fluid lines 158 may run between the carrier base 146 and the carrier ring 147. In these embodiments, the fluid lines 158 are used to blow a gas, preferably a non-oxidizing gas, onto a peripheral back edge 162 of the back surface 113 of the wafer 108. The non-oxidizing gas may preferably be nitrogen gas. Holes may have any number and varied diameters, but preferably a diameter in the range of 0.5–1 mm found most preferable. In the preferred embodiment, at 16–64 holes are disposed around the edge of the wafer carrier, for wafer sizes of between 200 and 300 mm. Of course, the number of such holes can vary, and, instead of holes, a continuous slit or slits, or another shaped opening can be used instead. The gas flow rate can vary, with a flow rate preferably between 10–60 liters per minute. As will be described more fully below, the gas emitted from ports 159 continuously sweeps the peripheral back edge 162 and provides another seal that assists in preventing liquid, such as electrolyte, from reaching behind the wafer 108 and causing unwanted contamination.

The wafer 108 is retained by the carrier base 146 by the application of vacuum suction. For this purpose, a number of vacuum lines 164 are connected to the second surface 152 of the carrier base 146. In order to support the back surface of the wafer, a support pad 166 or a backing pad is preferably, but not necessarily, attached on the second surface portion 152 to maintain the wafer in a substantially flat state while under the applied vacuum suction. When a support pad 166 is used, the vacuum lines 164 continue through holes in the support pad 166. Although in this embodiment the wafer is held by vacuum applied through the lines 164, the wafer may be held using a suction cup. In order for the seal to be created, the sealing member 154 must extend past the support pad 166, typically by an amount that is in the range of 50–100 microns, so that the seal can be properly formed. As described hereinafter, the sealing member 154 will be relatively much softer than the support pad 166.

The other components, such as mechanical components of the wafer carrier 106 may be conventionally constructed and well known in the art. The carrier head 106 may be provided with some form of gimbal mechanism and cooperating mechanical components. Such conventional components need not be further described.

In use, the wafer 108 is placed on the carrier base 146 as shown in FIGS. 3A and 3B, using a wafer handling system (not shown). The wafer 108 is aligned with the sealing member 154 and under the applied vacuum, the sealing member 154 seals the space confined between the second surface portion 152 and the back 113 of the wafer, thereby retaining the wafer 108 on the wafer carrier 106 and fully exposing the front surface 112 of the wafer 108. In the preferred embodiment, vacuum levels in the range of 400–650 Torr were employed.

Once the wafer 108 is held by the carrier 106, gas is blown through the ports 159 onto the peripheral back edge 162 as the wafer is processed during deposition, in an amount as described above.

Figure 4A:
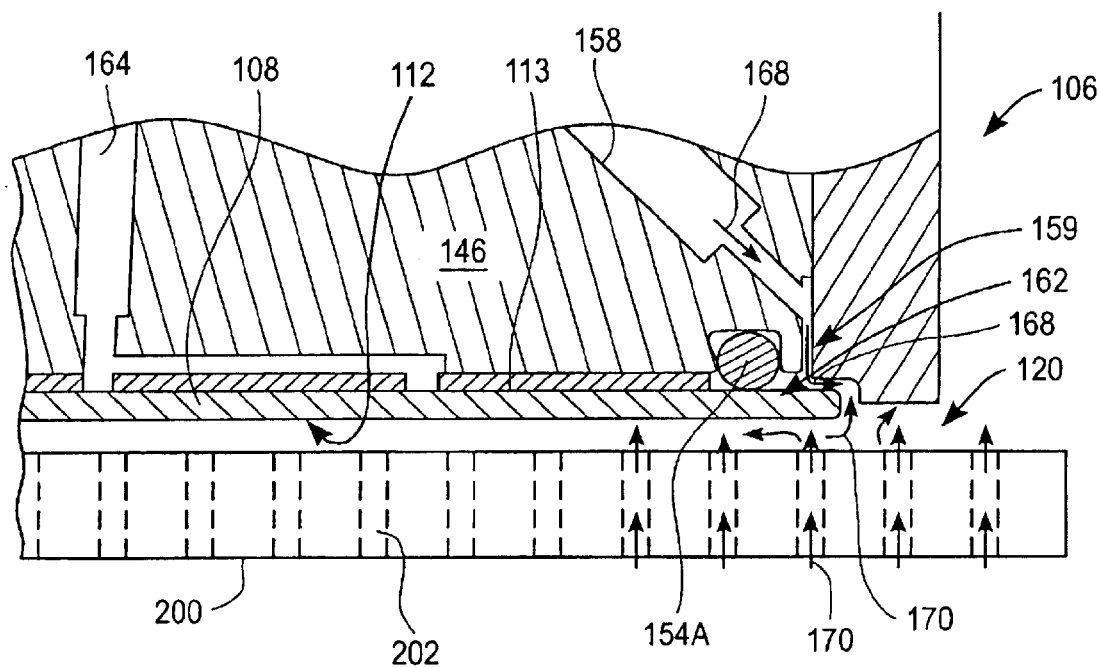
FIGS. 4A and 4B illustrate injected gas and process fluid flow using the wafer carriers according the two embodiments illustrated in FIGS. 3A and 3B of the present invention.
Figure 4B:
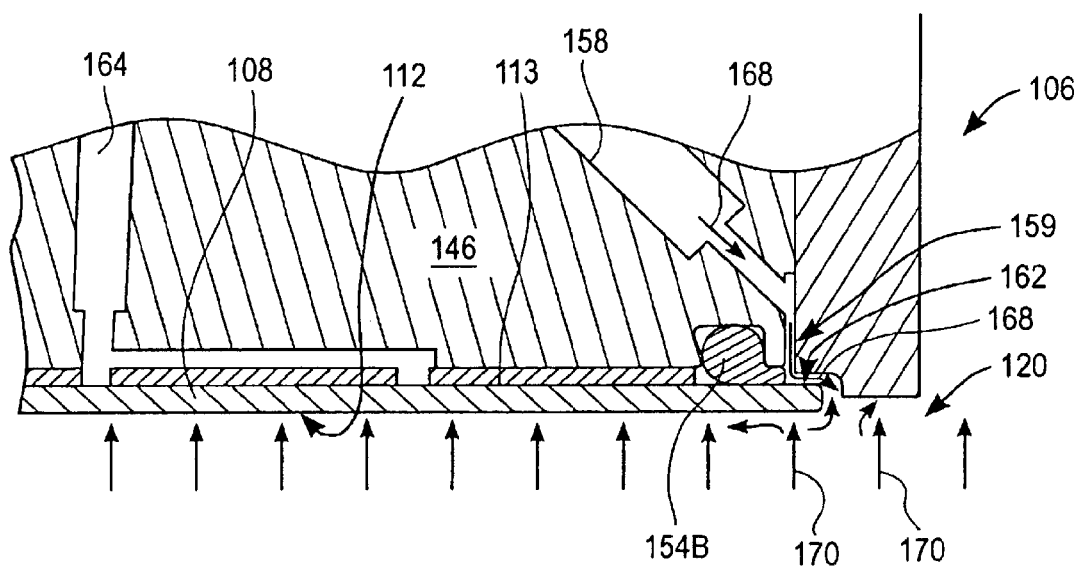

As shown in FIGS. 4A and 4B, during the above exemplified deposition process, the gas flow from the ports 159, in the direction of the arrow 168, sweeps away the electrolyte 120 flowing in the direction of the arrow 170 (delivered to the frontside of the wafer 108 through pad 200 that contains channels 202 therein) and assists in preventing the electrolyte solution front reaching the peripheral back edge 162 of the wafer 108. In cooperation with the sealing member 154, the wafer carrier of the present invention advantageously prevents the electrolyte from reaching the back surface 113 of the wafer 108 while rotating the wafer 108 relative to the pad 200 and fully exposing the front surface 112 of the wafer to the processing solutions.

During a subsequent cleaning step, however, the gas can be turned off so that it does not blow through the ports 159, thereby allowing for access to the backside of the wafer 108 to a liquid cleaning solution, a gas fluid such as air, or both.

In accordance with the principles of the present invention, the sealing member 154 is designed such that the sealing function is efficiently achieved with the application of minimum vacuum suction.

The sealing member 154A illustrated in FIGS. 3A and 4A is an o-ring made of an insulating material. The o-ring 154A may or may not be hollow inside, but as shown in FIG. 4A, it will tend to retain its shape under pressure. It has been found that preferably the o-ring 154A is hollow, having a diameter of 1–4 mm, and a thickness of between 0.5 and 1.5 mm. Put in other terms, there is softness to the hollow o-ring, such that it has a durometer rating of less than 70, and preferably within the range of 30–50 durometers, in contrast to typical o-rings that are much harder, and have a higher durometer rating, and support pads 166 that will have a durometer rating (which is a hardness rating) that typically are at least 5 times greater than that of the hollow o-ring. This softness advantageously allows for the desired seal to occur, without the detrimental side effect of causing bowing on the wafer due to the pressure of a hard seal exerting too much pressure onto the backside of the wafer. The o-ring 154A, particularly when hollow, is preferably made of an ethylene propylene material.

Figure 5:
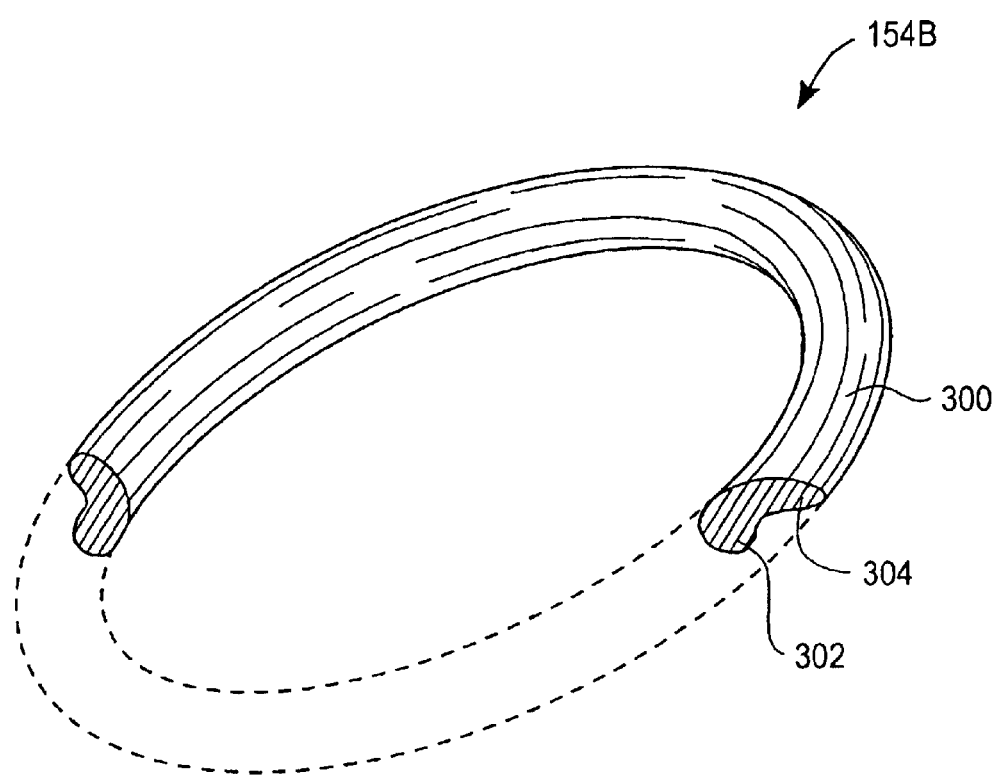
FIG. 5 illustrates a gasket member used in the embodiment of the present invention illustrated in FIGS. 3B and 4B.

The gasket 154B illustrated in FIGS. 3B and 4B is an alternative to the o-ring 154A. As shown in FIG. 5 in partial perspective view, the gasket 154B has a circular body 300 having a bulb shape cross section. The body 300 has a first portion 302 or an attachment portion and a second portion 304 or a sealing portion. The sealing portion 304 may preferably be slanted outwardly to offer more sealing surface when the vacuum is applied, which will be described more fully below.

Figure 6A:
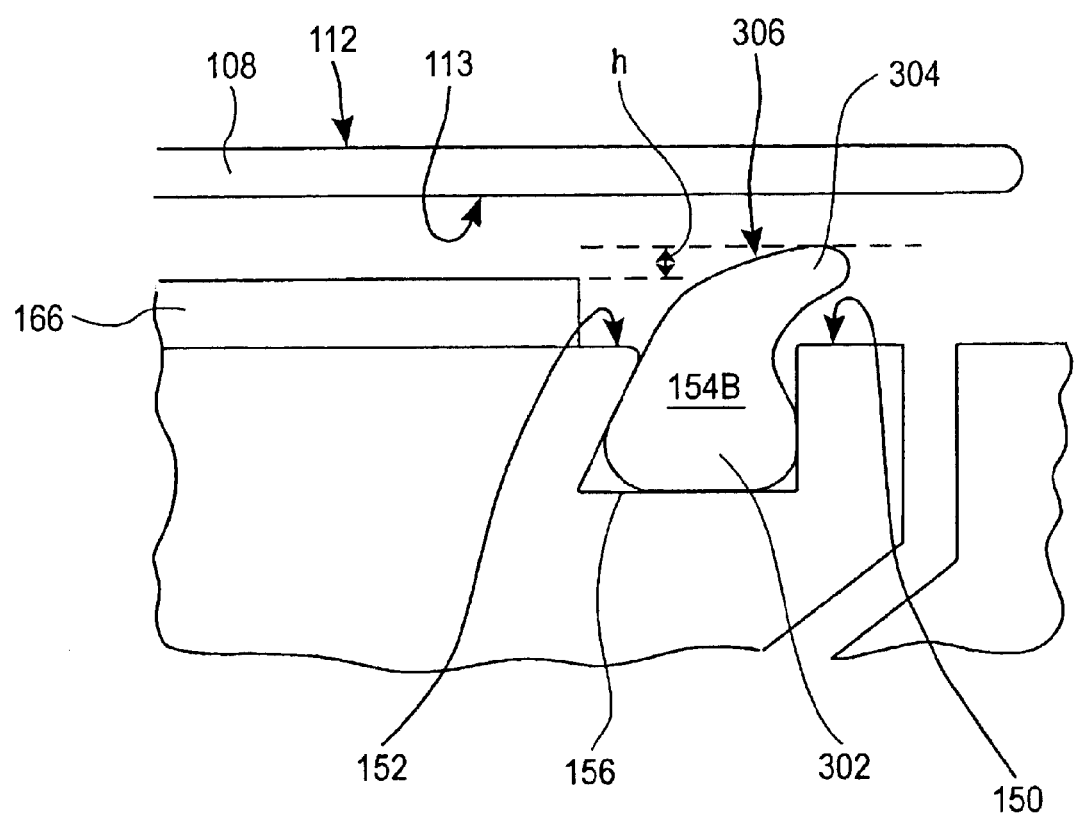
FIGS. 6A and 6B illustrate usage of the gasket member illustrated in FIG. 5 in more detail.

FIG. 6A shows the gasket 154B in cross section and with no compressive force applied upon it or no wafer held on it. Referring to FIG. 6A, the gasket 154B is placed on the wafer carrier by inserting the attachment portion 302 into the circular groove 156. The sealing portion 304 of the gasket 154B defines a sealing surface 306 which is a slanted surface generally facing the back surface 113 of the wafer 108. The sealing portion 304 is a compression distance, denoted with 'h', higher than the top of the support pad 166. The compression distance may be in the range of 0.1 mm to 0.3 mm, preferably 0.2 mm. In sealing stage, the compression distance 'h' is reduced to zero, allowing full usage of the sealing surface 306.

Figure 6B:
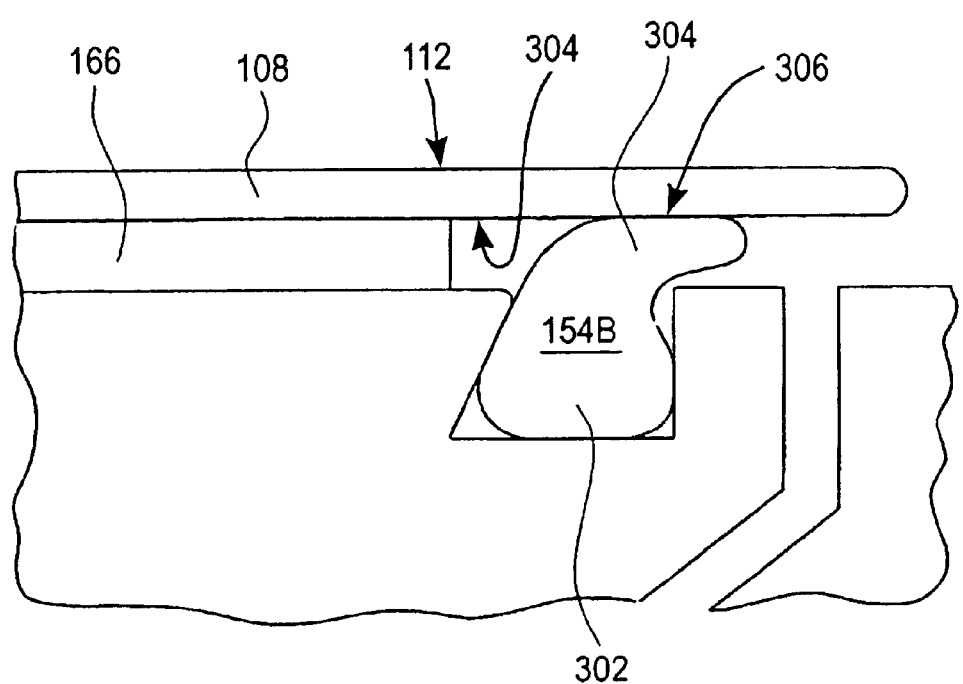

FIG. 6B shows the gasket 154B when sealing the back surface 113 of the wafer 108. As illustrated in FIG. 6B, as vacuum suction is applied to the back surface 113 of the wafer 108, the wafer 108 presses against the sealing surface 306 and causes the sealing portion 304 to collapse thereby achieving sealing function. The gasket 154B achieves sealing function with ease, i.e., by the collapse of the sealing portion 306 and with providing larger sealing surface.

In this embodiment, the gasket 154B can be made of an elastic material such as elastomer. One such material is commercially available under the brand name Kalrez™, which can be available from DuPont. It is understood, however, that although in the preferred embodiment the gasket member of the present invention is described above, the gasket member may be made of any compressible material, membrane, or tube, or the like, as long as it performs the above given sealing functions, and is within the scope of the present invention.

Figure 7A:
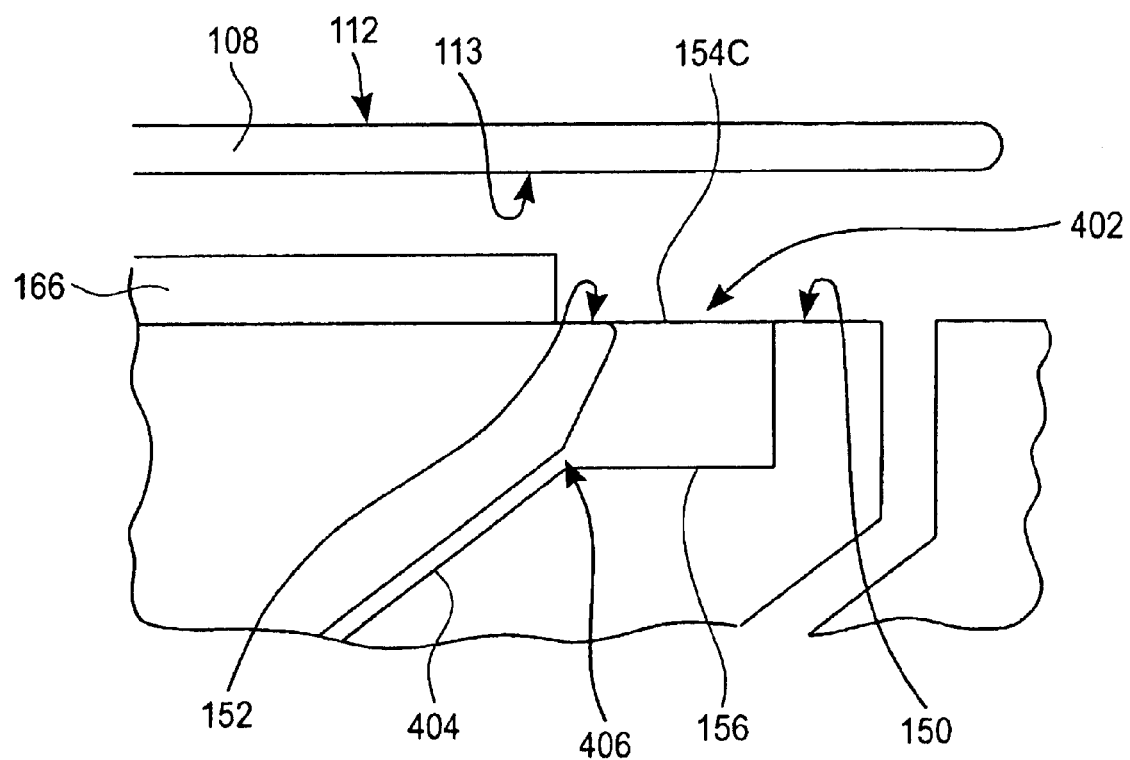
FIGS. 7A and 7B illustrate another embodiment of a the present invention using an inflatable gasket member.

As shown in FIG. 7A, in an alternative embodiment, a gasket member 154C may be an inflatable membrane. FIG. 7A shows the inflatable membrane in deflated stage. The inflatable membrane 154C is attached to and seals the perimeter edge of opening 402 of the circular grove 156. In this embodiment the circular groove is connected to a fluid line 404 through at least one inlet port 406 so that a fluid such as air can be used to inflate the inflatable membrane 154C. The fluid line 404 is further connected to a fluid supply system (not shown) such that the fluid pressure can be controlled.

Figure 7B:
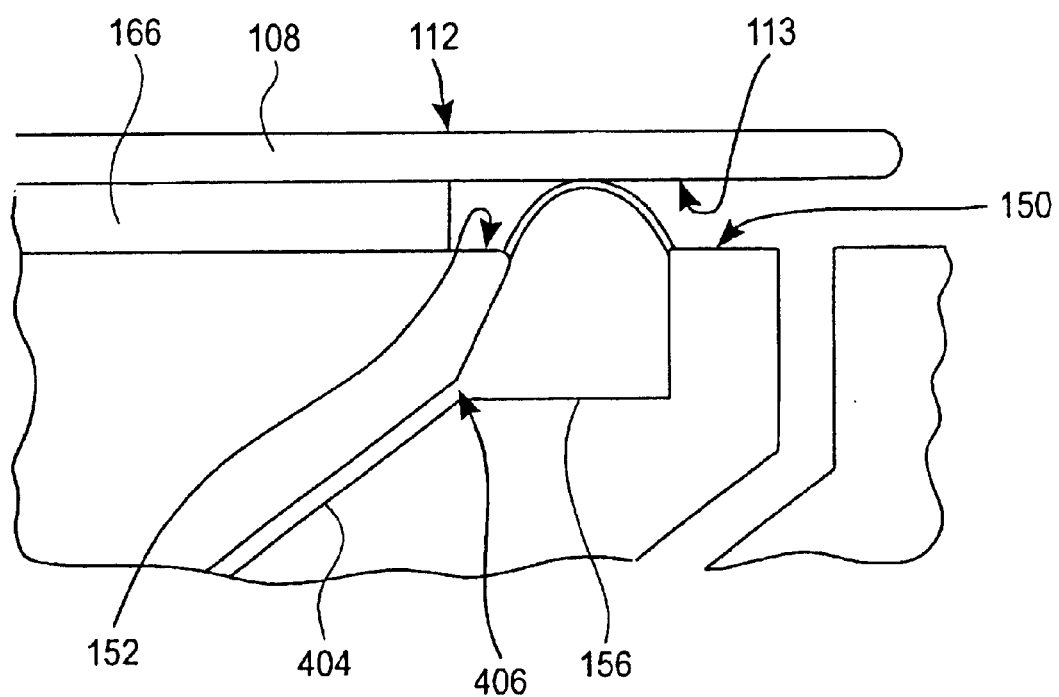

FIG. 7B shows the inflatable member 154C in inflated stage and when sealing the back surface 113 of the wafer 108. As vacuum suction is applied, the wafer 108 presses against the inflatable membrane thereby achieving sealing function. By controlling the fluid pressure, the force applied by the member 154C to the back of the wafer 108 may be optimized. This, in turn, provides efficient sealing without causing the above explained prior art wafer sinking problem. The inflatable member 154C may be made of any rubber or elastomer material.

It is also noted that it is within the scope of the present invention, as described above with reference to FIGS. 3A–7B to use any of the sealing members 154 as described injecting gas through the ports 159.

FIGS. 8A–8D illustrate another embodiment of the present invention using a pair of concentric sealing members. In this embodiment, as illustrated, a carrier head 500 comprises a carrier body 502 and a carrier base 504 where a wafer or other workpiece 505 is held. The carrier head 500 is rotated or moved through the shaft 508. The carrier base 504 comprises a bottom surface 506 that is preferably a surface that conforms to the shape of the workpiece, typically circular for a wafer. A first sealing member 508 and a second sealing member 509 are concentrically placed adjacent outer circumference 510 of the bottom surface 506.

The first sealing member 508 is preferably an inflatable gasket membrane having a circular strip shape. The membrane 508 is attached to the bottom surface 506 of the carrier base 504 from its inner and outer circumferential edges 512 and 514, respectively, such that an inner pocket 516 of the membrane 508 is formed. The inner pocket 516 of the membrane 508 is connected to a fluid source (not shown), such as a gas source, through fluid lines 518. As will be described below, the fluid from the fluid lines 518 is used to inflate the inflatable membrane 508 during the process. The second sealing member 509 is preferably made such as one of the sealing members 154 described above. In a particularly preferred embodiment, the second sealing member is made as the hollow o-ring 154A as described in FIGS. 3A and 4A. The second sealing member 509 is preferably placed in a circular groove 520. A support member 522 may be concentrically placed within the circular area formed by the o-ring 509. A number of vacuum lines 524 are formed through the carrier base 504 and through the support member 522 so that when the wafer 505 is placed on the support member 522, vacuum suction can be created on back side 526 of the wafer 505, which is sealed by the second sealing member 509.

Figure 8A:
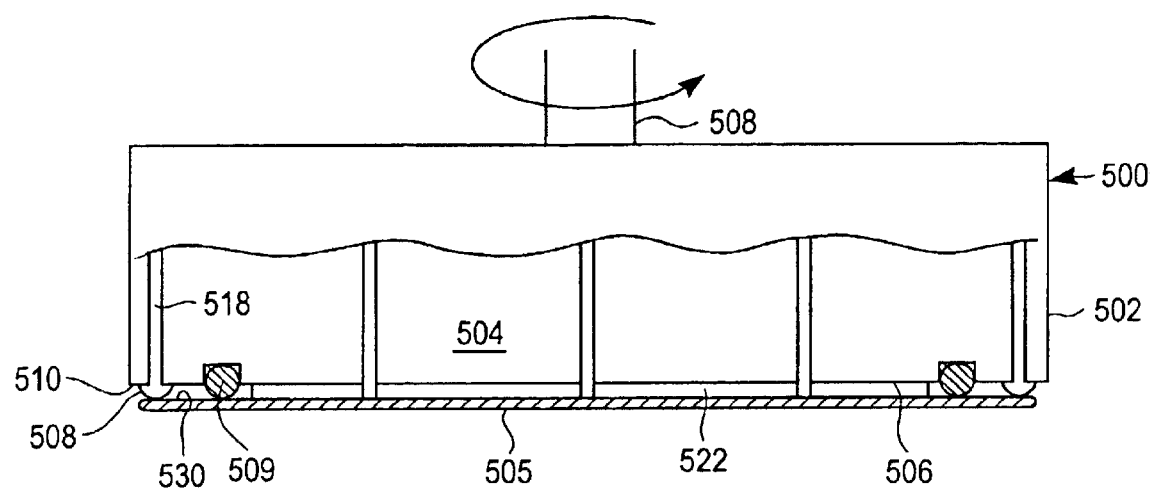
FIGS. 8A–8D illustrate another embodiment of the present invention using a pair of concentric gasket members.
Figure 8B:
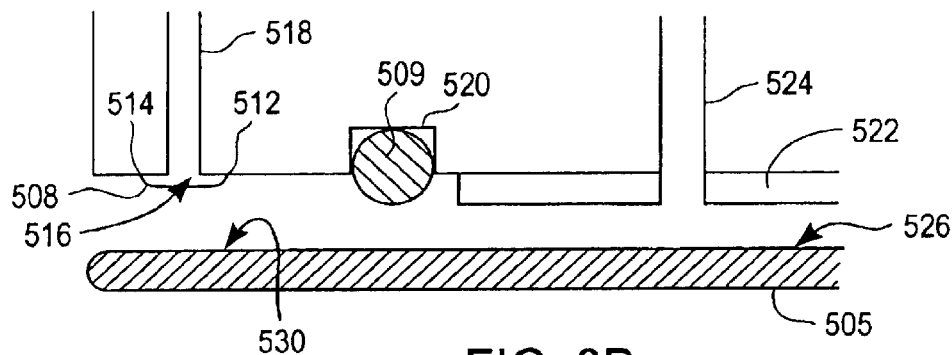
Figure 8C:
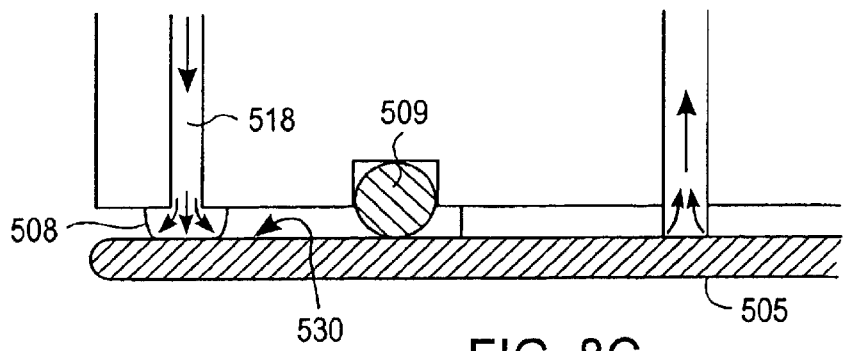

As shown in FIGS. 8A–8D, in operation, described in the preferred embodiment of the first sealing member 508 being an inflatable member and the second sealing member 509 being an o-ring, the back side 526 of the wafer 505 is placed on the o-ring 509 and vacuum suction is applied to hold the wafer 505 on the carrier 500. It is understood that in this embodiment, front surface 528 of the wafer 505 is fully exposed. As shown in FIG. 8C, next the inflatable membrane 508 is inflated by supplying gas into the inner pocket 516. In inflated state the inflatable membrane 509 effectively seals edge region 530 of the wafer 505. In this respect, the combination of both the inflatable membrane 508 and the o-ring 509 form a double seal along the circumference/edge of the wafer 505. Such combination advantageously prevents leakage of the process solutions, such as electrolyte, through both the inflatable member 508, and the o-ring 509 and prevents contamination of the backside 526 of the wafer as well as of the support member 522. And, even if there is some leakage within the inflatable member 508 of the process solution into the edge region 530 that exists between the inflatable member 508 and the o-ring 509, this edge region 530 can be easily cleaned, such as during a cleaning step after a plating step, as explained hereinafter.

Figure 8D:
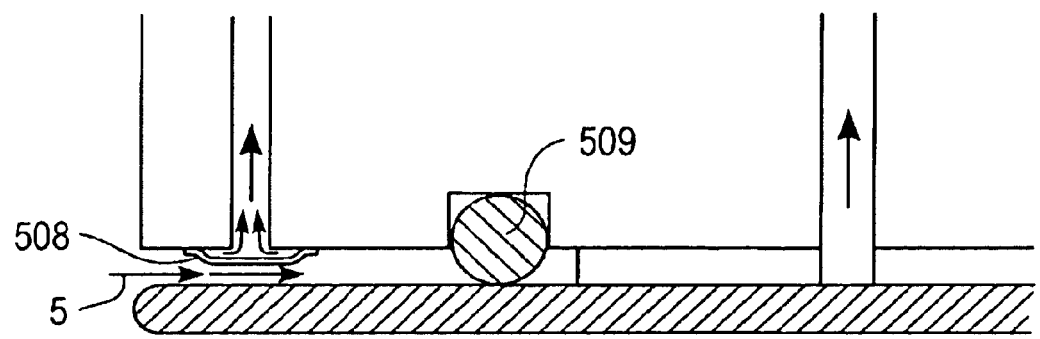

As shown in FIG. 8D, it becomes apparent why the first sealing member 508 is preferably an inflatable member. After a plating step, in which both the first sealing member 508, and the second sealing member 509 are providing a seal, is completed, the first sealing member 508, when an inflatable member, can be deflated, as shown. This exposes a potentially contaminated edge region 530 while the wafer is still being held by the carrier 500 and the vacuum suction is still being applied to the area sealed by the o-ring 509. Thus, in this configuration, cleaning of the edge region 530 can occur by applying a cleaning fluid or fluids (such as either a liquid cleaning fluid, or both a liquid cleaning fluid and thereafter a gas such as air for drying) in the direction of arrow into the edge region 530 from a cleaning system (not shown) into the area that had previously been protected to the inflated inflatable member 508. During the cleaning and a subsequent drying step the carrier 500 may also be spun. Although in this embodiment the first sealing member 508 is preferably an inflatable membrane, for the reasons described above, other alternative seals, for example an 0-ring, can also be used.

Figure 9A:
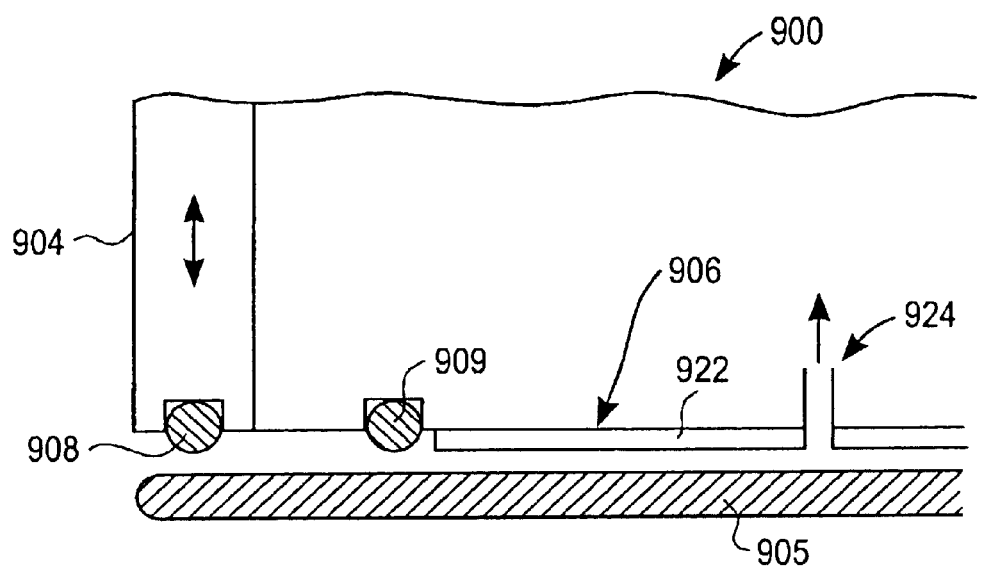
FIGS. 9A–9C illustrate another embodiment of the present invention using a pair of concentric gasket members.
Figure 9B:
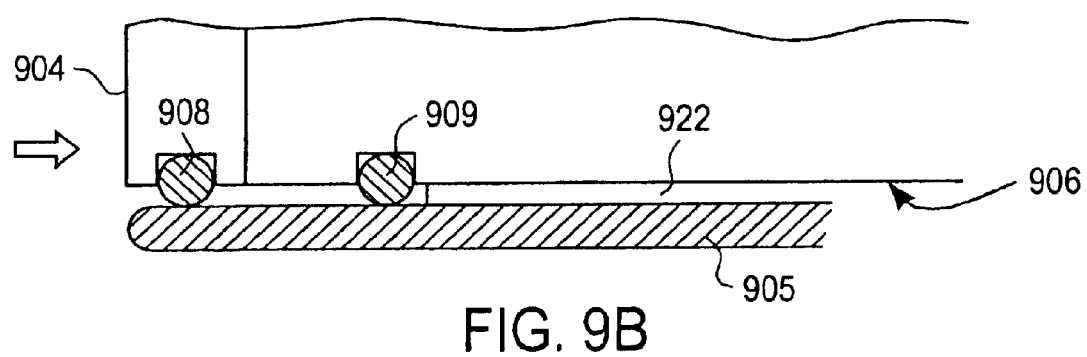
Figure 9C:
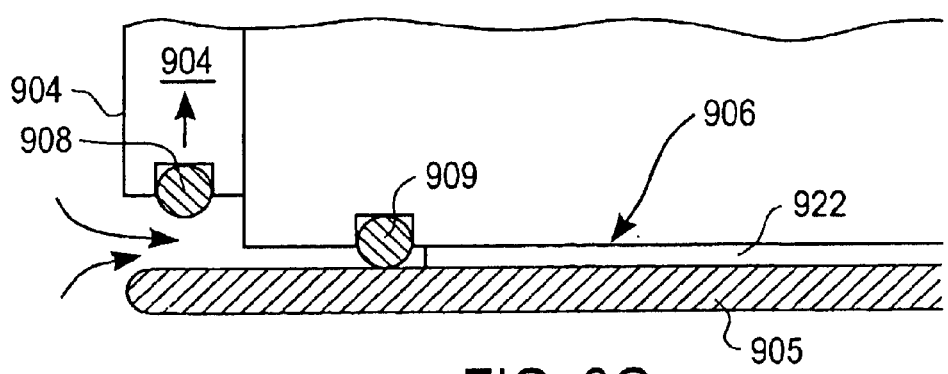

FIGS. 9A–9C illustrate another embodiment of the present invention using a pair of concentric gasket members. This embodiment is similar to the FIG. 8 embodiment, as shown in the overview of FIG. 9A, in using a first seal member 908 and a concentric second seal member 909 to provide a seal for the backside of the wafer 905 within the interior region formed by the second seal member 909, which interior region includes a support member 922. As in the previous embodiments the backside of the wafer 905 is preferably held on the second sealing member 909 and the support member 922 through the usage of a vacuum that is applied through vacuum lines 924. In contrast to the FIG. 8 embodiment, however, instead of having an inflatable first sealing member, the first sealing member 908 is preferably an o-ring, which may or may not be hollow inside, but preferably has a softness that is softer than that of the second sealing member 909. The seal with the first sealing member 908 is also formed by having a vertically moveable annular housing 904 on the outside of the carrier head 900. The vertical movability can be achieved in a variety of manners, including a motorized sprocket along the inner radius of the annular housing 904, other mechanical mechanisms, or otherwise.

FIG. 9B illustrates in more detail the sealed position, in which both the first seal member 908 and the second seal member 909 provide the sealing function. In this sealed position, the vertically moveable annular housing 904 is moved downward to establish the seal between the first sealing member 908 and the wafer 905. The wafer is processed in the chemical environment when both sealing members 908 and 909 seal the wafer 905. It is noted that there is no carrier ring with a surface portion that extends below the backside surface of the wafer 906, as is shown in FIG. 3A, to assist in preventing lateral movement of the wafer 905, and thus, the vacuum applied through vacuum lines 924 is solely used to prevent lateral movement of the wafer 905 relative to the carrier head 900. In the unsealed position, which allows a cleaning fluid, or gas, to be injected into the backside of the wafer outside of the second sealing member 909, as shown by the arrows in FIG. 9C, the vertically moveable annular housing is moved upward, thereby disengaging the first sealing member 908 and providing a gap through which the cleaning fluid or gas can be injected to the peripheral backside of the wafer 905, outside of the second sealing member 909.

With respect to the various sealing members described herein, it is further noted that each is preferably coated with a material that allows for chemical compatibility with the process being performed, such as Teflong® for chemical compatibility with plating that uses an electrolyte as well as cleaning with conventional cleaning solutions.

Although various preferred embodiments have been described in detail above, those skilled in the art will readily appreciate that many modifications of the exemplary embodiment are possible without materially departing from the novel teachings and advantages of this invention. For example, although an o-ring, gasket, and inflatable member are described to provide the vacuum seal, any material or device that may provide this sealing may replace o-ring and be within the scope of this invention. It will thus be appreciated that in some instances some features of the invention will be employed without a corresponding use of other features without departing from the spirit and scope of the invention as set forth in the appended claims.

What is claimed is:

1. A method of processing a frontside of a substrate using a processing solution while holding the substrate with a substrate holder using vacuum comprising the steps of:

attaching the substrate to the substrate holder using the vacuum, the substrate holder including an inner sealing member, the inner sealing member providing a seal for a backside region of the substrate;

providing another seal on the backside of the substrate using an outer sealing member that is disposed outside of the seal provided by the inner sealing member, the step of providing including the step of moving the outer sealing member to the backside region of the substrate;

processing the frontside of the substrate using the processing solution while the inner sealing member and the outer sealing member provide the seal and the another seal, respectively thereby substantially preventing the processing solution from reaching the backside region;

removing the another seal, the step of removing the another seal including the step of moving the outer sealing member away from the backside of the substrate upon completion of the processing of the frontside of the substrate; and cleaning a peripheral backside of the substrate using a cleaning solution.

2. The method according to claim 1 wherein the step of processing the frontside of the substrate performs chemical mechanical polishing of the frontside of the substrate using a pad, and wherein the frontside of the substrate and the pad are in contact with and move relative to each other.

3. The method according to claim 1 wherein the processing solution is a slurry.

4. The method according to claim 1 wherein the step of processing the frontside of the substrate performs electrochemical deposition of a conductor using an electrolyte as the processing solution.

5. The method according to claim 4 wherein the step of processing uses a pad for polishing of the substrate.

6. The method according to claim 1 wherein the step of processing the frontside of the substrate performs electropolishing of the frontside of the substrate using a pad for polishing of the substrate.

7. The method according to claim 1 wherein the seal provided by the vacuum during the step of attaching holds the substrate to the substrate holder without a clamp during the processing, and thereby provides for full face processing of the frontside of the substrate.

8. The method according to claim 7 wherein the seal provided by the vacuum of the inner sealing member and the another seal provided by the outer sealing member solely prevent lateral movement of the substrate during processing relative to the substrate holder.

9. The method according to claim 8 wherein the step of processing the frontside of the substrate performs chemical mechanical polishing of the frontside of the substrate using a pad, and wherein the frontside of the substrate and the pad are in contact with and move relative to each other.

10. The method according to claim 9 wherein the processing solution is a slurry.

11. The method according to claim 8 wherein the step of processing the frontside of the substrate performs electrochemical deposition of a conductor using an electrolyte as the processing solution.

12. The method according to claim 11 wherein the step of processing uses a pad for polishing of the substrate.

13. The method according to claim 8 wherein the step of processing the frontside of the substrate performs electropolishing of the frontside of the substrate using a pad for polishing of the substrate.

14. The method according to claim 7 wherein the substrate holder does not include a carrier ring that operates to prevent lateral movement of an edge of the substrate beyond the carrier ring.

15. The method according to claim 14 wherein the step of processing the frontside of the substrate performs chemical mechanical polishing of the frontside of the substrate using a pad, and wherein the frontside of the substrate and the pad are in contact with and move relative to each other.

16. The method according to claim 15 wherein the processing solution is a slurry.

17. The method according to claim 14 wherein the step of processing the frontside of the substrate performs electrochemical deposition of a conductor using an electrolyte as the processing solution.

18. The method according to claim 17 wherein the step of processing uses a pad for polishing of the substrate.

19. The method according to claim 14 wherein the step of processing the frontside of the substrate performs electropolishing of the frontside of the substrate using a pad for polishing of the substrate.

20. The method according to claim 1 wherein only the seal of the inner sealing member provided by the vacuum holds the substrate to the substrate holder during the step of cleaning.

21. The method according to claim 20 wherein the seal provided by the vacuum of the inner sealing member and the another seal provided by the outer sealing member solely prevent lateral movement of the substrate during processing relative to the substrate holder and wherein the step of processing performs full face processing of the frontside of the substrate.

22. The method according to claim 20 wherein the substrate holder does not include a carrier ring that operates to prevent lateral movement of an edge of the substrate beyond the carrier ring and wherein the step of processing performs full face processing of the frontside of the substrate.

23. The method according to claim 20 wherein the inner sealing member is an o-ring and the outer sealing member is another o-ring.

24. The method according to claim 23 wherein the o-ring is an elastomeric o-ring having a durometer rating of less than 70.

25. The method according to claim 24 wherein the elastomeric o-ring is an elastomeric hollow o-ring that has a durometer rating within the range of 30–50.

26. The method according to claim 1 further including a spin drying step to dry the substrate after the step of cleaning.

27. The method according to claim 20 wherein the inner sealing member is an o-ring and the outer sealing member is an inflatable membrane.

28. The method according to claim 27 wherein the step of providing includes the step of inflating the inflatable membrane and the step of removing includes the step of deflating the inflatable membrane.

29. The method according to claim 28 wherein the step of processing the frontside of the substrate performs chemical mechanical polishing of the frontside of the substrate using a pad, and wherein the frontside of the substrate and the pad are in contact with and move relative to each other.

30. The method according to claim 28 wherein the step of processing the frontside of the substrate performs electrochemical deposition of a conductor using an electrolyte as the processing solution.

31. The method according to claim 28 wherein the step of processing the frontside of the substrate performs electropolishing of the frontside of the substrate using a pad for polishing of the substrate.

32. The method according to claim 28 wherein the step of processing the frontside of the substrate performs chemical mechanical polishing of the frontside of the substrate using a pad, and wherein the frontside of the substrate and the pad are in contact with and move relative to each other.

33. The method according to claim 23 wherein:
the step of providing the another seal moves the another o-ring attached to a vertically moveable housing of the substrate holder to a seal position; and
the step of removing the another seal retracts the vertically moveable housing of the substrate holder and the another o-ring to result in an unsealed position.

34. The method according to claim 33 wherein the step of processing the frontside of the substrate performs chemical mechanical polishing of the frontside of the substrate using a pad, and wherein the frontside of the substrate and the pad are in contact with and move relative to each other.

35. The method according to claim 33 wherein the step of processing the frontside of the substrate performs electrochemical deposition of a conductor using an electrolyte as the processing solution.

36. The method according to claim 33 wherein the step of processing the frontside of the substrate performs electropolishing of the frontside of the substrate using a pad for polishing of the substrate.

37. The method according to claim 33 wherein the step of processing the frontside of the substrate performs chemical mechanical polishing of the frontside of the substrate using a pad, and wherein the frontside of the substrate and the pad are in contact with and move relative to each other.

38. The method according to claim 1 further comprising a cleaning step, prior to the step of removing the another seal, to clean the substrate using a cleaning solution.

* * * * *